United States Patent [19]

Aitken

[11] Patent Number: 4,682,566
[45] Date of Patent: Jul. 28, 1987

[54] EVACUATED EQUIPMENT

[75] Inventor: Derek Aitken, East Molesey, England

[73] Assignee: Applied Materials, Inc., Santa Clara, Calif.

[21] Appl. No.: 308,659

[22] Filed: Oct. 5, 1981

Related U.S. Application Data

[63] Continuation of Ser. No. 136,677, Apr. 2, 1980, abandoned.

[30] Foreign Application Priority Data

Apr. 6, 1979 [GB] United Kingdom ............... 7912217

[51] Int. Cl.[4] ............................................. F28F 23/00
[52] U.S. Cl. .................................... 118/724; 118/728;
165/46; 165/185; 165/80.4; 250/429; 250/492.2
[58] Field of Search ............... 250/492.2, 398, 429,
250/238; 165/46, 185, 80 R, 80 A–80 E, 83,
DIG. 8; 118/724, 728

[56] References Cited

U.S. PATENT DOCUMENTS

| 2,595,328 | 5/1952 | Bowen | 165/46 |
| 2,799,793 | 7/1957 | DeCain | 165/DIG. 8 |
| 2,967,984 | 1/1961 | Jamison | 165/DIG. 8 |
| 3,294,661 | 12/1966 | Maissel | 204/192 R |
| 3,586,102 | 6/1971 | Gilles | 165/185 |
| 3,764,511 | 10/1973 | Glick et al. | 204/298 |
| 3,807,188 | 4/1974 | Lagodmos | 165/185 X |
| 3,965,973 | 6/1976 | Thettu et al. | 165/185 X |
| 4,092,697 | 5/1978 | Spaight | 165/46 X |
| 4,155,402 | 5/1979 | Just | 165/46 |
| 4,261,762 | 4/1981 | King | 165/185 X |

OTHER PUBLICATIONS

Kleinfelder et al, Liquid–Filled Bellows Heat Sink, IBM Tech. Disc. Bulletin, vol. 21, No. 10, Mar. 1979, pp. 4125–4126.

Primary Examiner—William R. Cline
Attorney, Agent, or Firm—William R. Hinds

[57] ABSTRACT

The use, for heat transfer in evacuable or other equipment, of a thermally conductive fluid, confined by a flexible diaphragm, for heat transfer across the diaphragm between the fluid and a component placed in thermal contact with the diaphragm.

15 Claims, 2 Drawing Figures

EVACUATED EQUIPMENT

This is a continuation of application Ser. No. 136,677 filed Apr. 2, 1980, now abandoned.

The invention relates to heat transfer and in particular to heat transfer in evacuated equipment, for example equipment for ion or electron beam bombardment of targets, and in particular ion implanters for the processing of semiconductor components.

In many circumstances reliable thermal contact is required within evacuated equipment, either between separate parts of the equipment or between parts of the equipment and components being processed in it.

In particular, silicon wafers undergoing high-dose ion implantation have very poor and unpredictable thermal contact with the heat sinks necessary to prevent them overheating, and implantation for applications such as solar cell manufacture and predeposition implantation has to be either intermittent or at low power to allow heat dispersal.

The principle of the present invention is to make use, for effective thermal transfer particularly in evacuated equipment, of a thermally conductive fluid, confined by a flexible diaphragm, for heat transfer across the diaphragm between the fluid and a component placed in thermal contact with the diaphragm. In particular the fluid, confined by its flexible diaphragm, may be disposed between one part of equipment and another, or between a part of the equipment and a component being processed in it, with the diaphragm in contact with that other part or component.

The invention also extends to a thermal transfer unit comprising a mounting, a flexible diaphragm secured to the mounting, and, confined between the mounting and the diaphragm, a body of fluid for conduction of heat between the mounting and, in use, a component requiring heating or cooling and placed in thermal contact with the diaphragm.

The use of the diaphragm allows effective heat transfer not at a few isolated points as on contact between rigid bodies when convective transfer is absent under vacuum but across the contact area as a whole, the diaphragm conforming closely to the surface of the part or component, contact is maintained by any convenient means, for example clips for individual components.

In principle there is no restriction on the fluid but preferably it is chosen for high heat conductivity and, as a safeguard against contamination of the equipment should the diaphragm be damaged, low vapour pressure.

The diaphragm may for example be of silicone rubber or, for higher temperatures, tantalum foil.

By low vapour pressure we mean $1 \times 10^{-5}$ torr or less, preferably $1 \times 10^{-9}$ torr or less, at 30° C., that is to say vapour pressures in the high vacuum range. Fluids meeting this requirement include certain commercially available high vacuum oils comprising fluorinated polyphenol ethers, for example "Fomblin" 140/13 (Montedison) which has a vapour pressure of $2 \times 10^{-12}$ torr at 20° C., and low-melting point metals such as gallium and its binary or ternary alloys with indium and tin. The metals are preferable, for good thermal transfer, or alternatively a fluid such as one of the above oils loaded with a finely divided solid material of higher heat conductivity, for example silver or other metal, graphite or boron nitride. Graphite is available in high heat conductivity grades and has the particular advantage that its density is near that of the oil and settling out is unlikely.

It will be understood that the term fluid is used herein to cover materials that are liquid or alternatively pasty or viscous, and which further may contain solid materials as described above. Gaseous materials are excluded as unsuitable for effective thermal transfer. They would in any event exert undesired pressure on the flexible diaphragm in an evacuated system and risk contaminating the whole system in the event of a rupture.

While 'low vapour pressure' is defined above in terms of the vapour pressure at certain temperatures, no particular limitation on the operating temperature of the equipment is envisaged. The fluid used simply has to be matched to the operating temperature. Gallium for example melts at 29.8° C., indium at 156.6° C., tin at 232° C., and the binary eutectic of indium and tin (52 wt % indium) at 117° C., providing alternatives to the low melting point alloys discussed below if desired. If operation at raised temperatures is required, for example in a heating rather than cooling application, the vapour pressures are still very low, for example $1 \times 10^{-28}$ torr for gallium at 100° C. and indeed still in the ultra high vacuum range of $1 \times 10^{-11}$ torr at 400° C.

Generally however, and in particular in ion implanters, the temperatures envisaged are water cooling temperatures of 10° to 25° C. At these temperatures suitable metals are for example (weight compositions):

Ga 92%, Sn 8%, m.p. 20° C.
Ga 76%, In 24%, m.p. 16° C.
Ga 62.5%, In 21.5%, Sn 16%, m.p. 10.7° C.
Ga 69.8%, In 17.6%, Sn 12.5%, m.p. 10.8° C.

The vapour pressures of all these alloys are very low, being for the individual metals:

Ga (29.8° C.): $1 \times 10^{-36}$ torr
In (30° C.): $1 \times 10^{-32}$ torr
Sn (30° C.): $1 \times 10^{-36}$ torr There are no serious compatibility problems between the gallium-based liquid metals and containment and structural materials. Stainless steel and copper are both suitable at moderate temperatures, though the stainless steel is less good for heat transfer. Above 100° C. chromium plated copper is very suitable, having an excellent resistance to attack up to 400° C.

The invention is illustrated in the accompanying drawings in which.

Figure 1:
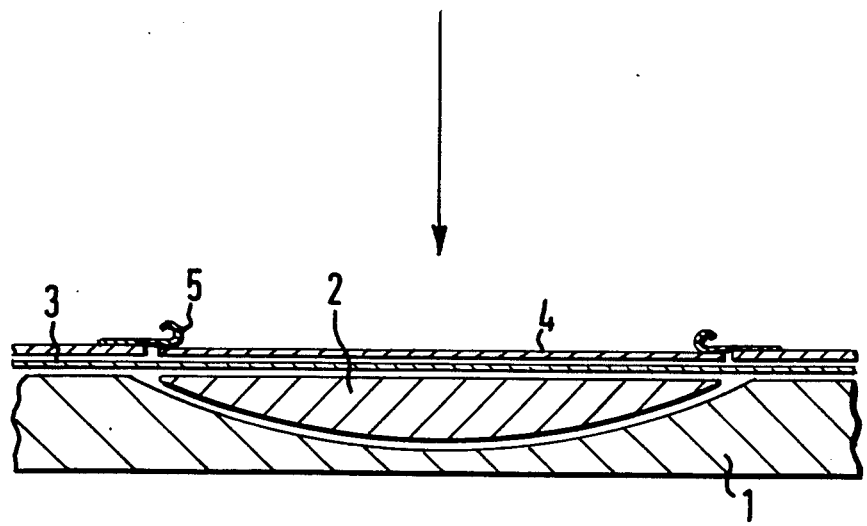
FIG. 1 is a sketch of a silicon wafer in position on a heat sink.

In FIG. 1, the heat sink 1, body of liquid metal alloy 2, diaphragm 3, wafer 4 and clips 5 are all shown slightly separated for clarity. In fact of course the metal fills the space between the diaphragm and the heat sink, and the wafer is closely applied to the diaphragm by the clips. Heat is finally lost by water cooling at for example 17° C. The material of the diaphragm is 0.005 inch silicone rubber sheet, and for example at a heat flow of 1 watt/sq cm the temperature gradient over an 0.005 inch thick silicone rubber diaphragm is 6° C. A typical heat flow in solar cell implantation is 5 watts/sq. cm, giving a temperature gradient of 30° C. At ordinary ambient temperature of 20° C. this gives a wafer temperature a long way below the level of 100° C. at which for example problems with photoresist coatings are found.

Figure 2:
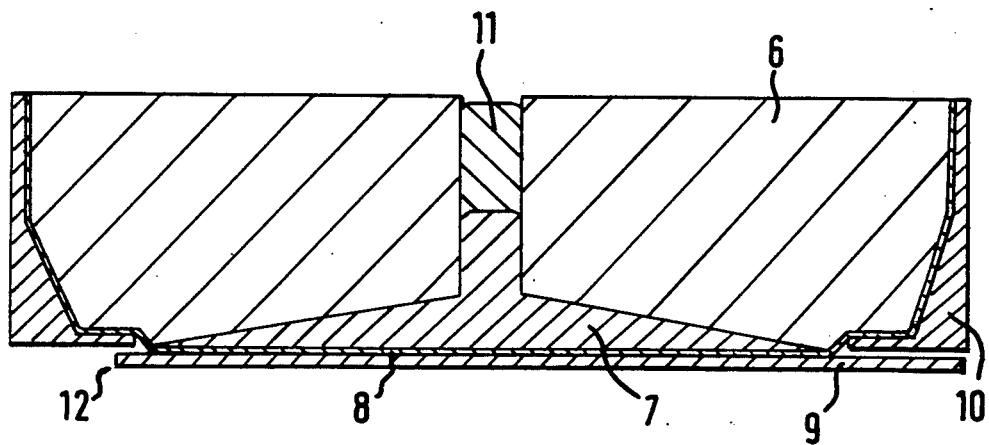
FIG. 2 is as FIG. 1 but in detail.

FIG. 2 shows a diaphragm and associated parts in detail, designed for easy production. The diaphragm needs to be slightly stretched, so as not to wrinkle in use, and also to have an amount of liquid metal behind it that will make it slightly convex at rest. A wafer clipped over it then comes in firm contact over essentially the whole surface of the diaphragm. The parts are a water cooled chromium plated copper heat sink disc 6, a body of liquid metal alloy 7, a silicone rubber diaphragm 8, a silicon wafer 9 and an outer clamp ring 10 holding the diaphragm in place. The liquid metal alloy is confined by a plug of silicone rubber encapsulant 11 in a bore in the heat sink disc.

Production is as follows, referring to the parts shown in the Fig:

1. Place the outer clamp ring face down on a flat surface;
2. Coat the inner surface of the ring with silicone rubber adhesive and then place the silicone rubber diaphragm on top of the ring;
3. Coat the outer surface of the heat sink disc with the adhesive and carefully press the disc into position in the clamp ring, allowing the diaphragm to stretch slightly;
4. After the adhesive is dry, place the assembly on a shallowly concave surface in an evacuable enclosure and pour in liquid metal alloy (L.M.A.) through the central filling hole in the disc until the meniscus reaches a position, previously determined in conjunction with the concavity of the surface, that gives a proper amount of alloy in the assembly;
5. Evacuate the assembly, allowing any trapped air bubbles to escape (the concave lower face of the heat sink disc makes such escape easy);
6. Vent to atmosphere, top up with alloy if necessary, and seal the filling hole with liquid silicone rubber encapsulant;
7. Re-evacuate, to remove any bubbles from the encapsulant or the encapsulant/metal interface;
8. Vent and allow encapsulant to cure.

Typical dimensions are 4 mm depth and 75 mm, 100 mm or 125 mm assembly diameter. The heat sink disc is of chromium plated copper, the clamp ring for example of steel, turned as shown or pressed. It will be noted that the silicon wafer when in position covers the diaphragm entirely, including the position 12 of the flat normally present on the wafers, so that the diaphragm is not degraded by the ion implant beam. The area of the wafer not in contact with the diaphragm (exaggerated in the drawing) is unimportant.

What is claimed is:

1. In combination, in evacuable equipment for processing components under vacuum, the improvement, in securing heat transfer between one part of the equipment and another part or between a part of the equipment and a component being processed therein, comprising a body of thermally conductive fluid in thermal contact with said first mentioned part of the equipment and confined by a flexible diaphragm disposed for separable, direct, surface-conforming thermal contact with said other part or component.

2. In a method of effecting heat transfer in evacuable equipment for processing a component under vacuum, the improvement comprising using a thermally conductive fluid, confined by a flexible diaphragm, for heat transfer across the diaphragm between the fluid and a component placed in separable, direct, surface-conforming thermal contact with the diaphragm, the component being processed under vacuum while in such contact with the diaphragm and thereafter removed.

3. In a method of effecting heat transfer between a component and a heat sink while the component is subjected to treatment in an evacuated space in which the component is temporarily located, the improvement comprising enhancing the heat transfer by locating the component in said space in separable, direct surface-conforming, thermal contact with one face of a flexible diaphragm confining on its other face a thermally conductive fluid which is in thermal communication with said heat sink so as to effect heat transfer across the surface-conforming portion of the diaphragm between the component and the fluid and hence the heat sink, the component being treated under vacuum and thereafter separated from the diaphragm and removed from said space.

4. The improvement as claimed in claim 3 wherein the fluid has a vapor pressure of at most $1 \times 10^{-5}$ torr at 30° C.

5. The improvement as claimed in claim 3 wherein the fluid has a vapor pressure of at most $1 \times 10^{-9}$ torr at 30° C.

6. The improvement as claimed in claim 3 wherein the fluid contains a finely divided solid material selected from silver, other metals, graphite and boron nitride.

7. The improvement as claimed in claim 3 wherein the fluid is gallium or gallium alloy of melting point below 29.8° C.

8. The improvement as claimed in claim 3 wherein the fluid is gallium or a gallium/indium, gallium/tin or gallium/indium/tin alloy.

9. A method as claimed in claim 3 wherein said component is a semi-conductor component undergoing ion implantation under evacuated conditions.

10. A method as claimed in claim 3 wherein said component is subjected to ion or electron beam bombardment under evacuated conditions.

11. The improvement as claimed in claim 1, 2 or 3 wherein the fluid is a fluorinated polyphenyl ether high vacuum oil.

12. The improvement as claimed in claim 1, 2 or 3 wherein the fluid contains a finely divided solid material of higher thermal conductivity than the fluid.

13. The improvement as claimed in claim 1, 2 or 3 wherein the fluid is a metal, as such or as an alloy.

14. The improvement as claimed in claim 1, 2 or 3 wherein the diaphragm is of silicone rubber or tantalum foil so as to conform readily to an abutting surface for a specified temporary time, and to be readily separable therefrom thereafter.

15. Apparatus as claimed in claim 1 wherein said evacuable equipment comprises a vacuum chamber, said first mentioned part of the equipment comprises a heat sink body positioned in said vacuum chamber, said heat sink body being formed of solid material having high thermal conductivity and having one major face with a recessed region formed therein, said flexible diaphragm being mounted over said major face of said heat sink body and being rigidly clamped at edge regions thereof to said heat sink body to form with said recessed region a liquid tight enclosure, said thermally conductive fluid comprising a heat transfer liquid filling said liquid tight enclosure and having a volume sufficient to form said diaphragm normally into a slightly convex shape, and said component comprising a flat wafer element positioned on said diaphragm and urged into positive contact therewith by an applied clamping force to achieve good direct heat transfer from said wafer into said heat sink body through said heat transfer liquid.

* * * * *